United States Patent
Zhang

(10) Patent No.: US 11,943,954 B2
(45) Date of Patent: Mar. 26, 2024

(54) ENCAPSULATION STRUCTURE AND ENCAPSULATION METHOD FOR FLEXIBLE ORGANIC LIGHT-EMITTING DIODE DEVICE

(71) Applicant: Wuhan China Star Optoelectronics Semiconductor Display Technology Co., Ltd., Hubei (CN)

(72) Inventor: Wenzhi Zhang, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 902 days.

(21) Appl. No.: 16/966,037

(22) PCT Filed: Mar. 16, 2020

(86) PCT No.: PCT/CN2020/079460
§ 371 (c)(1),
(2) Date: Jul. 30, 2020

(87) PCT Pub. No.: WO2021/098091
PCT Pub. Date: May 27, 2021

(65) Prior Publication Data
US 2023/0180509 A1 Jun. 8, 2023

(30) Foreign Application Priority Data
Nov. 18, 2019 (CN) .......................... 201911124495.8

(51) Int. Cl.
*H10K 50/844* (2023.01)
*H10K 71/00* (2023.01)
*H10K 102/00* (2023.01)

(52) U.S. Cl.
CPC ............ *H10K 50/844* (2023.02); *H10K 71/00* (2023.02); *H10K 2102/311* (2023.02)

(58) Field of Classification Search
CPC ...... H10K 30/00; H10K 30/87; H10K 50/813; H10K 50/822; H10K 30/81; H10K 50/82;
(Continued)

(56) References Cited

U.S. PATENT DOCUMENTS 9,391,298 B2  7/2016  Xic
9,583,728 B2  2/2017  Km et al.
(Continued)

FOREIGN PATENT DOCUMENTS

CN  103490019  1/2014
CN  104701461  6/2015
(Continued)

*Primary Examiner* — Michael Lebentritt

(57) ABSTRACT

The present disclosure provides an encapsulation structure and an encapsulation method for a flexible OLED device. The encapsulation structure for the flexible OLED device comprises an organic matter protective layer, one or more continuous organic flat layers, one or more inorganic barrier layers, and one or more organic layers sequentially disposed on the OLED device. An outermost surface of each organic layer is treated with plasma to become a surface hardened layer, which forms an organic barrier layer with an unhardened portion of the organic layer. The surface hardened layer can prevent moisture invasion and erosion, thereby extending a service life of the OLED device. The unhardened portion of the organic barrier layer can completely release tensile stress of an inorganic layer. The encapsulation structure for the flexible OLED device improves moisture and oxygen blocking performance and reduces a risk of degradation of a thin-film encapsulation structure during bending.

10 Claims, 3 Drawing Sheets

(58) Field of Classification Search
CPC .... H10K 85/113; H10K 30/30; H10K 85/215; H01L 31/022425

See application file for complete search history.

(56) References Cited

U.S. PATENT DOCUMENTS

| | | | |
|---|---|---|---|
| 2012/0125880 A1* | 5/2012 | Slafer | H10K 71/621 216/11 |
| 2015/0014663 A1 | 1/2015 | Kwak et al. | |
| 2015/0380683 A1 | 12/2015 | You | |
| 2019/0334123 A1 | 10/2019 | Zhang | |

FOREIGN PATENT DOCUMENTS

| | | | | |
|---|---|---|---|---|
| CN | 104752634 | | 7/2015 | |
| CN | 108539044 | | 9/2018 | |
| CN | 109817673 | | 5/2019 | |
| CN | 110061149 | | 7/2019 | |
| CN | 110085767 | | 8/2019 | |
| WO | WO-2013000162 A1 * | 1/2013 | ......... | H01L 51/5088 |

* cited by examiner

ENCAPSULATION STRUCTURE AND ENCAPSULATION METHOD FOR FLEXIBLE ORGANIC LIGHT-EMITTING DIODE DEVICE

RELATED APPLICATIONS

This application is a National Phase of PCT Patent Application No. PCT/CN2020/079460 having International filing date of Mar. 16, 2020, which claims the benefit of priority of Chinese Patent Application No. 201911124495.8 filed on Nov. 18, 2019. The contents of the above applications are all incorporated by reference as if fully set forth herein in their entirety.

FIELD AND BACKGROUND OF THE INVENTION

The present disclosure relates to a technical field of encapsulation and its preparation, and particularly to an encapsulation structure and an encapsulation method for a flexible organic light-emitting diode (OLED) device.

Currently, organic light-emitting diode (OLED) is considered as the most promising technology in a field of flexible display. However, organic materials are easily eroded by moisture and oxygen, which limits service lives of OLED devices. Therefore, preventing the OLED devices from contacting moisture and oxygen by an encapsulation process is crucial to stability of OLED display screens.

In order to solve this problem, currently, an organic/inorganic thin-film stack structure is commonly used to simultaneously block OLED devices from moisture and oxygen and achieve flexible bending. As shown in FIG. 1, an outermost layer of a thin-film encapsulation structure is a dense inorganic layer 152, which can block moisture and oxygen. An inner layer of the thin-film encapsulation structure is an organic polymer layer 151, which can planarize and encapsulate impurity particles, and also help to release stress between layers.

However, in such organic/inorganic thin-film stacked encapsulation structure, when an OLED display screen is bent outward, tensile stress of the outermost inorganic layer 152 cannot be completely released, and thus the outermost inorganic layer 152 is easily peeled, separated or even broken.

SUMMARY OF THE INVENTION

In order to solve the problem that an organic light-emitting diode (OLED) display screen is easily peeled, separated or even broken when it is bent outward, the present disclosure provides an encapsulation structure and an encapsulation method for a flexible OLED device.

The present disclosure provides an encapsulation structure for an OLED device comprising an organic matter protective layer, one or more continuous organic flat layers, one or more inorganic barrier layers, and one or more organic layers sequentially disposed on the OLED device; wherein an outermost surface of each of the organic layers is treated with plasma to become a surface hardened layer, and the surface hardened layer and an unhardened portion of the organic layer form an organic barrier layer.

Based on the above technical solution, the present invention can also be improved as follows.

In an embodiment, each of the organic layers is a continuous thin-film having a thickness of 3 μm to 6 μm.

In an embodiment, the surface hardened layer has a thickness of 100 nm to 200 nm.

In an embodiment, each of the organic layers is a discontinuous thin-film.

In an embodiment, each of the organic layers comprises a plurality of independent block unit thin-films, and each of the block unit thin-films covers a single pixel or a plurality of pixels adjacent to each other in the OLED device.

In an embodiment, each of the organic layers comprises a plurality of independent strip unit thin-films, and each of the strip unit thin-films covers a single row of pixels or a plurality of rows of pixels adjacent to each other in the OLED device.

In an embodiment, the one or more organic layers are made of an organic silicone-based material.

In an embodiment, the plasma is $O_2$ plasma or $CO_2$ plasma.

The present disclosure further provides a method for encapsulating a flexible OLED device. The method comprises: sequentially disposing an organic matter protective layer, one or more continuous organic flat layers, one or more inorganic barrier layers, and one or more organic layers on the OLED device; and treating an outermost surface of each of the organic layers with plasma to form a surface hardened layer, wherein the surface hardened layer and an unhardened portion of the organic layer form an organic barrier layer.

In an embodiment, the treating the outermost surface of each of the organic layers with the plasma to form the surface hardened layer comprises: adjusting a ratio of the plasma and time of treating the organic layer with the plasma so that the surface hardened layer has a thickness of 100 nm to 200 nm.

Beneficial effects of the present invention are as follows. An organic layer is disposed on an outermost layer of an OLED device and is treated by a plasma surface treatment process, so that an outermost surface of the organic layer becomes a thin surface hardened layer. The surface hardened layer and a remaining unhardened portion of the organic layer form an organic barrier layer. The surface hardened layer can prevent moisture invasion and erosion, thereby extending a service life of the OLED device. The unhardened portion of the organic barrier layer can help to completely release tensile stress of an inorganic layer. An encapsulation structure for a flexible OLED device of the present invention can improve moisture and oxygen blocking performance and simultaneously reduce a risk of degradation of a thin-film encapsulation structure during bending.

BRIEF DESCRIPTION OF THE SEVERAL VIEWS OF THE DRAWINGS

In order to more clearly illustrate the technical solutions in the embodiments of the present disclosure, a brief description of accompanying drawings used in the description of the embodiments of the present disclosure will be given below. Obviously, the accompanying drawings in the following description are merely some embodiments of the present disclosure. For those skilled in the art, other drawings may be obtained from these accompanying drawings without creative labor.

DESCRIPTION OF SPECIFIC EMBODIMENTS OF THE INVENTION

Specific embodiments of the present invention will be further described in detail below with reference to accompanying drawings and examples. The following examples are used to illustrate the present invention, but not to limit scope of the present invention.

In a field of organic light-emitting diode (OLED) flexible displays, organic materials of OLED devices are easily eroded by moisture and oxygen, which will affect service lives of the OLED devices. Preventing the OLED devices from contacting with moisture and oxygen by an encapsulation process can extend the service lives of the OLED devices.

Figure 1:
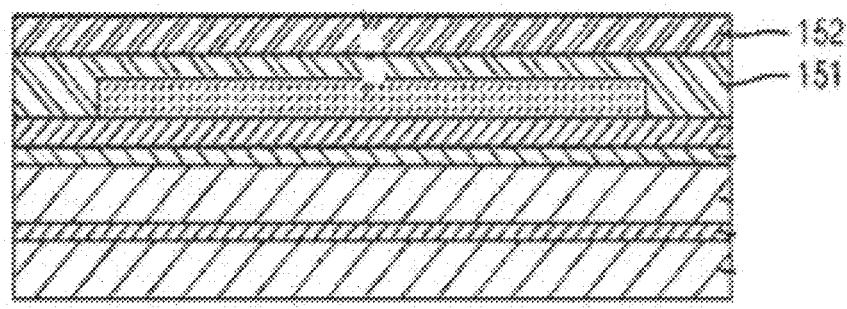
FIG. 1 is a schematic diagram of an encapsulation structure for an organic light-emitting diode (OLED) device in the prior art.

In current mainstream thin-film encapsulation structures, an organic/inorganic thin-film stack structure is commonly used to simultaneously block moisture and oxygen and achieve flexible bending. As shown in FIG. 1, an outermost layer of a thin-film encapsulation (TFE) structure is a dense inorganic layer 152, which can block moisture and oxygen. An inner layer of the TFE structure is an organic polymer layer 151, which can planarize and encapsulate impurity particles, and also help to release stress between layers. However, it should be noted that, in such encapsulation structure of FIG. 1, when an OLED display screen is bent outward, tensile stress of the outermost inorganic layer cannot be completely released, and thus the outermost inorganic layer is easily peeled, separated or even broken.

From a mechanical point of view, disposing an additional organic layer on an outside of the inorganic layer can solve the problem. However, most organic polymers easily absorb and hold moisture. If the outermost layer of the TFE structure is an organic layer, it is easy to cause erosion of the TFE structure. Furthermore, a surface of an organic matter has a small hardness, and thus is prone to damage such as scratches in subsequent module manufacturing processes. Therefore, in general, an organic layer is not suitable to be disposed on an outermost side of a TFE structure.

Plasma process is a common surface treatment process. Studies have shown that $O_2$, $CO_2$, and air plasma can oxidize organic polymers, thereby modifying surfaces of the organic polymers. $O_2$ plasma can effectively increase a Si-to-O ratio of a surface of a polydimethylsiloxane (PDMS) thin-film and reduce a corresponding Si-to-C ratio, thereby increasing a hardness of the surface of the PDMS thin-film. Similar related studies have shown that a surface of a PDMS thin-film will become a thin $SiO_x$-rich modified layer after $O_2$ plasma treatment. The modified layer is confirmed to reduce gas permeability of the surface of the PDMS thin-film and block moisture and oxygen.

Based on the above theoretical knowledge, in order to not only prevent an OLED device from being eroded by moisture and oxygen but also reduce a risk of degradation of a TFE structure during bending, an embodiment of the present invention provides an encapsulation structure for a flexible OLED device, which can enhance bending performance. Please refer to FIG. 2 to FIG. 6, the encapsulation structure comprises an organic matter protective layer 30, one or more continuous organic flat layers 40, one or more inorganic barrier layers 50, and one or more organic layers 60 sequentially disposed on the OLED device 20. An outermost surface of each of the organic layers 60 is treated with plasma to become a surface hardened layer 602, and the surface hardened layer 602 and an unhardened portion 601 of the organic layer 60 form an organic barrier layer.

The one or more organic layers 60 are made of an organic silicone-based material. An outer surface of each of the organic layers 60 is treated with plasma to become a thin hardened layer on a surface of an organic silicone-based thin-film, which is hereinafter referred to as a surface hardened layer 602 for convenience of description. The plasma is $O_2$ plasma or $CO_2$ plasma. The component of the surface hardened layer 602 is between organic silicon and inorganic silicon. The surface hardened layer 602 and the remaining unhardened portion 601 form the organic barrier layer. The outermost organic barrier layer of the TFE structure can improve moisture and oxygen blocking performance and simultaneously reduce the risk of the degradation of the TFE structure during bending thereby extending a service life of the OLED device.

In an embodiment of the present invention, each of the organic layers may be a continuous thin-film or a discontinuous thin-film. When each of the organic layers is a continuous thin-film, the thin-film has a thickness of 3 μm to 6 μm, and the surface hardened layer has a thickness of 100 nm to 200 nm. When each organic layer is a discontinuous thin-film, each organic layer may comprise a plurality of independent block unit thin-films, and each of the block unit thin-films covers a single pixel or a plurality of pixels adjacent to each other in the OLED device. Each organic layer may also comprise a plurality of independent strip unit thin-films, and each of the strip unit thin-films covers a single row of pixels or a plurality of rows of pixels adjacent to each other in the OLED device.

An embodiment of the present disclosure further provides a method for encapsulating a flexible OLED device. The method mainly comprises: sequentially disposing an organic matter protective layer, one or more continuous organic flat layers, one or more inorganic barrier layers, and one or more organic layers on the OLED device; and treating an outermost surface of each of the organic layers with plasma to form a surface hardened layer, wherein the surface hardened layer and an unhardened portion of the organic layer form an organic barrier layer.

In an embodiment of the present invention, a specific process of an encapsulation structure for a flexible OLED device comprises:

(1) Depositing a layer of fluorine-containing organic matter as a protective layer on the OLED device by thermal evaporation, pulsed laser deposition (PLD), or the like, which covers an entire display area of the OLED device and has a thickness between 10 nm and 100 nm. The organic matter protective layer may be composed of, but is not limited to, polytetrafluoroethylene (PTFE), polyvinylidene fluoride (PVDF), or polyvinyl fluoride (PVF).

(2) Forming one or more continuous organic flat layers on the organic matter protective layer by ink-jet printing (IJP), coating, or the like. An edge portion of each organic flat layer is located in a coverage area of the organic matter protective layer. Each organic flat layer has a thickness between 1 μm and 10 μm and is composed of, but is not limited to, acrylic resin, epoxy resin, silicone resin, polydimethylsiloxane (PDMS), or hexamethyldisiloxane (HMDSO).

(3) Forming one or more inorganic barrier layers on the one or more organic flat layers by plasma enhanced chemical vapor deposition (PECVD), atomic layer deposition (ALD), PLD, Sputter, or the like. Each inorganic barrier layer is a continuous thin-film covering the entire display area of the OLED device. An edge portion of each inorganic barrier layer extends to a non-display area of the OLED device. Each inorganic barrier layer has a thickness between 500 nm and 1.5 μm and is composed of, but is not limited to, $Al_2O_3$, $TiO_2$, $CrO_2$, $SiN_X$, $SiON_X$, or $SiO_X$.

(4) Forming one or more organic layers on the one or more inorganic barrier layers by IJP, coating, or the like. Each organic layer has a thickness between 1 μm and 10 μm and is composed of, but is not limited to, silicone resin, polydimethylsiloxane (PDMS), or hexamethyldisiloxane (HMDSO).

(5) Treating an outer surface of each organic layer with plasma by a plasma treatment process, so that the outer surface of each organic layer becomes a surface hardened layer, that is, a surface hardened layer. The surface hardened layer has a thickness between 50 nm and 500 nm. The surface hardened layer and a remaining unhardened portion of the organic layer form an organic barrier layer. The plasma for the plasma treatment process comprises, but is not limited to, $O_2$ plasma and $CO_2$ plasma.

A method for encapsulating an OLED device is described in detail below with a specific embodiment.

Figure 2:
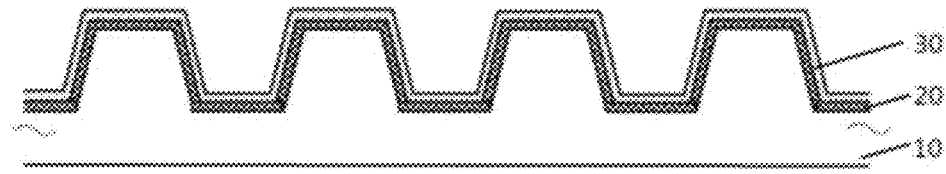
FIG. 2 is a schematic structural diagram showing that an organic matter protective layer is disposed on an OLED device according to an embodiment of the present invention.

First step: as shown in FIG. 2, disposing an OLED device 20 on a back plate 10, and disposing an organic matter protective layer 30 having a thickness between 10 nm and 100 nm on the OLED device 20 by thermal evaporation, PLD, or the like. The organic matter protective layer 30 may be composed of, but is not limited to, polytetrafluoroethylene (PTFE), polyvinylidene fluoride (PVDF), or polyvinyl fluoride (PVF). The organic matter protective layer 30 covers an entire display area of the OLED device 20.

Figure 3:
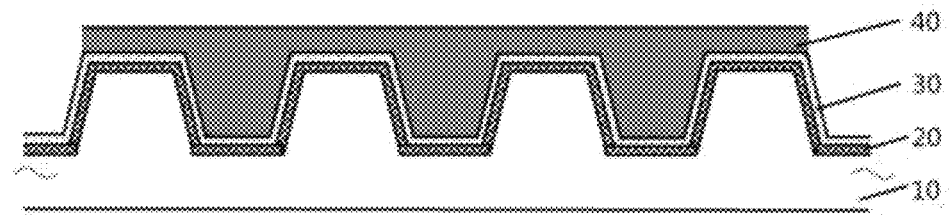
FIG. 3 is a schematic structural diagram showing that an organic flat layer is disposed on an organic matter protective layer according to an embodiment of the present invention.

Second step: as shown in FIG. 3, forming a continuous organic flat layer 40 on the organic matter protective layer 30 by ink-jet printing (IJP), coating, or the like. An opening of the organic flat layer 40 is smaller than an opening of the organic matter protective layer 30. The organic flat layer 40 preferably has a thickness between 3 μm and 6 μm and is composed of, but is not limited to, acrylic resin, epoxy resin, silicone resin, polydimethylsiloxane (PDMS), or hexamethyldisiloxane (HMDSO).

Figure 4:
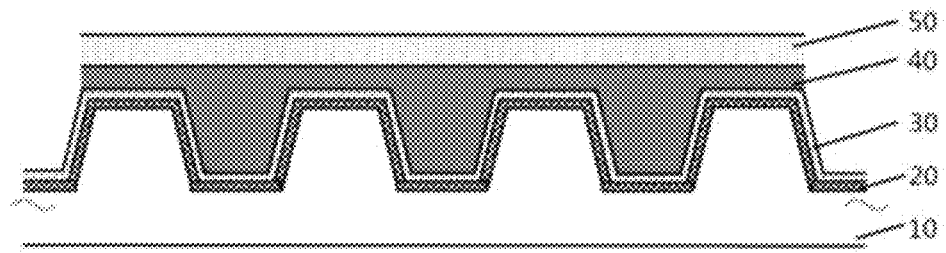
FIG. 4 is a schematic structural diagram showing that an inorganic barrier layer is disposed on an organic flat layer according to an embodiment of the present invention.

Third step: as shown in FIG. 4, forming an inorganic barrier layer 50 on the organic flat layer 40 by PECVD, ALD, PLD, Sputter, or the like. The inorganic barrier layer 50 is a continuous thin-film covering the entire display area of the OLED device 20. An opening of the inorganic barrier layer 50 is larger than the opening of the organic flat layer 40. The inorganic barrier layer 50 preferably has a thickness between 500 nm and 1 μm and is composed of, but is not limited to, $Al_2O_3$, $TiO_2$, $CrO_2$, $SiN_X$, $SiON_X$, or $SiO_X$.

Figure 5:
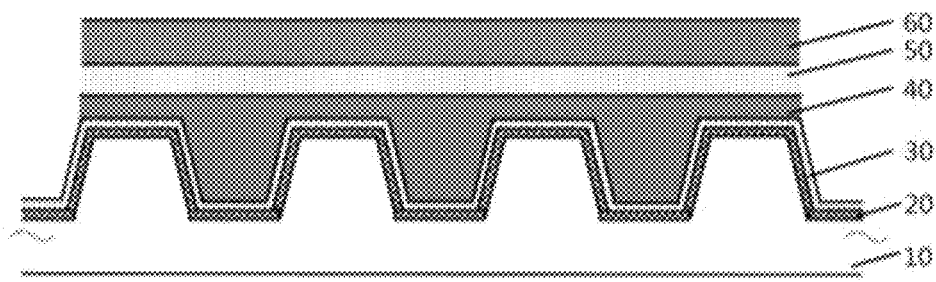
FIG. 5 is a schematic structural diagram showing that an organic layer is disposed on an inorganic barrier layer according to an embodiment of the present invention.

Fourth step: as shown in FIG. 5, forming one or more organic layers on the one or more inorganic barrier layers by IJP, coating, or the like. Each organic layer has a thickness between 1 μm and 10 μm and is composed of, but is not limited to, silicone resin, polydimethylsiloxane (PDMS), or hexamethyldisiloxane (HMDSO).

Figure 6:
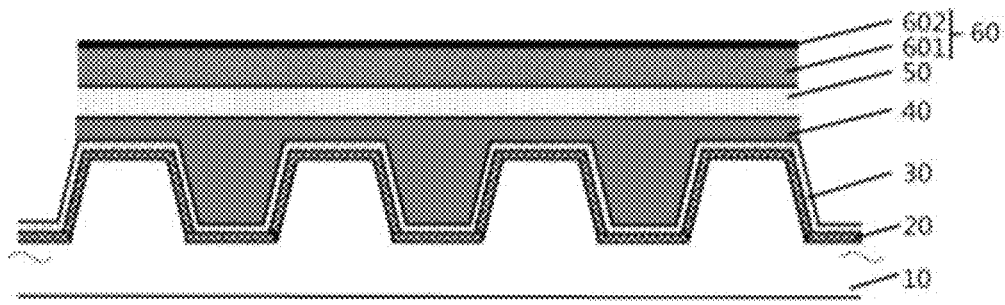
FIG. 6 is a schematic diagram of forming an organic barrier layer according to an embodiment of the present invention.

Fifth step: as shown in FIG. 6, treating a surface of the cured organic layer 60 by a plasma treatment process so that the surface of the organic layer 60 becomes a thin surface hardened layer 602. The surface hardened layer 602 and an unhardened portion 601 of the organic layer 60 finally form an organic barrier layer. Preferably, the plasma treatment process is performed on the surface of the organic layer 60 with $O_2$ plasma. During the plasma treatment process, adjusting a ratio of $O_2$ plasma and time of treating the surface of the organic layer 60 by the plasma treatment process so that the generated surface hardened layer 602 preferably has a thickness between 100 nm and 200 nm.

Figure 7:
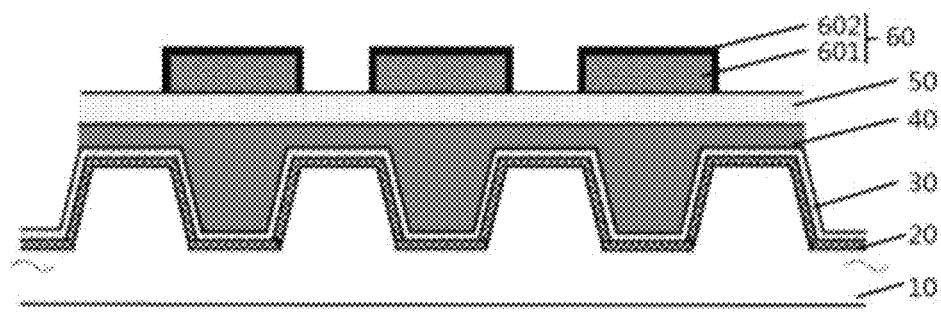
FIG. 7 is a schematic structural diagram showing that an organic barrier layer comprises a plurality of independent block unit thin-films according to an embodiment of the present invention.

A method for encapsulating an OLED device is described in detail below with another specific embodiment. As shown in FIG. 7, a flow of the method of this embodiment is similar to that of the above embodiment, and differs from that of the above embodiment in that the organic barrier layer of the above embodiment is a continuous thin-film, but an organic barrier layer of this embodiment is preferably a discontinuous thin-film.

Figure 8:
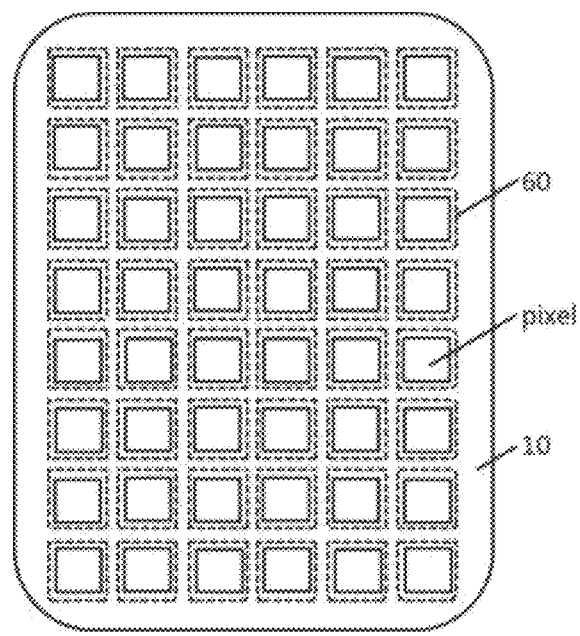
FIG. 8 is a schematic diagram showing that the block unit thin-films of FIG. 7 cover pixels.

In an embodiment of the present invention, as shown in FIG. 8, when an organic barrier layer is a discontinuous thin-film, the organic layer comprises a plurality of independent block unit thin-films, and each of the block unit thin-films may cover a single pixel or a plurality of pixels adjacent to each other in an OLED device 20 thin-film.

Figure 9:
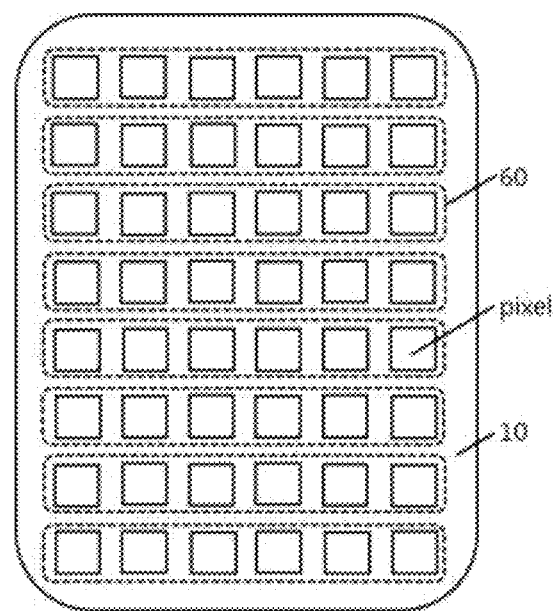
FIG. 9 is a schematic diagram showing that an organic barrier layer comprises a plurality of independent strip unit thin-films covering pixels according to an embodiment of the present invention.

In another embodiment of the present invention, as shown in FIG. 9, when an organic barrier layer is a discontinuous thin-film, the organic layer may also comprise a plurality of independent strip unit thin-films, and each of the strip unit thin-films may cover a single row of pixels or a plurality of rows of pixels adjacent to each other in an OLED device thin-film.

The above description of various embodiments of the present disclosure with reference to the accompanying drawings is used to illustrate specific embodiments that can be practiced. Directional terms mentioned in the present disclosure, such as "above", "below", "front", "rear", "left", "right", "inside", "outside", "side", are merely used to indicate the direction of the accompanying drawings. Therefore, the directional terms are used for illustrating and understanding the present disclosure rather than limiting the present disclosure. In the figures, elements with similar structures are indicated by the same reference numerals.

It should be noted that a thickness and shape of each layer in the accompanying drawings of the present invention do not reflect true proportions, and are only intended to schematically illustrate embodiments of the present application.

The present disclosure provides an encapsulation structure and an encapsulation method for a flexible OLED device, in which an organic layer is disposed on an outermost layer of the OLED device and is treated by a plasma surface treatment process, so that an outermost surface of the organic layer becomes a thin surface hardened layer. The surface hardened layer and a remaining unhardened portion of the organic layer form an organic barrier layer. The surface hardened layer can prevent moisture invasion and erosion, thereby extending a service life of the OLED device. The unhardened portion of the organic barrier layer can help to completely release tensile stress of an inorganic layer. An encapsulation structure for a flexible OLED device of the present invention can improve moisture and oxygen blocking performance and simultaneously reduce a risk of degradation of a thin-film encapsulation structure during bending.

In the above, the present application has been described in the above preferred embodiments, but the preferred embodiments are not intended to limit the scope of the present application, and those skilled in the art may make various modifications without departing from the scope of the present application. The scope of the present application is determined by claims.

What is claimed is:

1. An encapsulation structure for a flexible organic light-emitting diode (OLED) device, comprising an organic matter protective layer, one or more continuous organic flat layers, one or more inorganic barrier layers, and one or more organic layers sequentially disposed on the OLED device;
   wherein an outermost surface of each of the organic layers is treated with plasma to become a surface hardened layer, and the surface hardened layer and an unhardened portion of the organic layer form an organic barrier layer;
   wherein a material of the organic matter protective layer comprises polytetrafluoroethylene, polyvinylidene fluoride, or polyvinyl fluoride; and
   wherein an opening of the organic flat layer is smaller than an opening of the organic matter protective layer.

2. The encapsulation structure for the flexible OLED device according to claim 1, wherein each of the organic layers is a continuous thin-film having a thickness of 3 μm to 6 μm.

3. The encapsulation structure for the flexible OLED device according to claim 2, wherein the surface hardened layer has a thickness of 100 nm to 200 nm.

4. The encapsulation structure for the flexible OLED device according to claim 1, wherein each of the organic layers is a discontinuous thin-film.

5. The encapsulation structure for the flexible OLED device according to claim 4, wherein each of the organic layers comprises a plurality of independent block unit thin-films, and each of the block unit thin-films covers a single pixel or a plurality of pixels adjacent to each other in the OLED device.

6. The encapsulation structure for the flexible OLED device according to claim 4, wherein each of the organic layers comprises a plurality of independent strip unit thin-films, and each of the strip unit thin-films covers a single row of pixels or a plurality of rows of pixels adjacent to each other in the OLED device.

7. The encapsulation structure for the flexible OLED device according to claim 1, wherein the one or more organic layers are made of an organic silicone-based material.

8. The encapsulation structure for the flexible OLED device according to claim 1, wherein the plasma is $O_2$ plasma or $CO_2$ plasma.

9. A method for encapsulating a flexible organic light-emitting diode (OLED) device, comprising:
   sequentially disposing an organic matter protective layer, one or more continuous organic flat layers, one or more inorganic barrier layers, and one or more organic layers on the OLED device; and
   treating an outermost surface of each of the organic layers with plasma to form a surface hardened layer, wherein the surface hardened layer and an unhardened portion of the organic layer form an organic barrier layer;
   wherein a material of the organic matter protective layer comprises polytetrafluoroethylene, polyvinylidene fluoride, or polyvinyl fluoride; and
   wherein an opening of the organic flat layer is smaller than an opening of the organic matter protective layer.

10. The method for encapsulating the flexible OLED device according to claim 9, wherein the treating the outermost surface of each of the organic layers with the plasma to form the surface hardened layer comprises:
    adjusting a ratio of the plasma and time of treating the organic layer with the plasma so that the surface hardened layer has a thickness of 100 nm to 200 nm.

* * * * *